United States Patent
Lee et al.

(10) Patent No.: US 8,345,463 B2
(45) Date of Patent: Jan. 1, 2013

(54) RESISTIVE MEMORY DEVICE AND METHOD FOR FABRICATING THE SAME

(75) Inventors: Yu-Jin Lee, Gyeonggi-do (KR);
Yun-Taek Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 336 days.

(21) Appl. No.: 12/411,455

(22) Filed: Mar. 26, 2009

(65) Prior Publication Data

US 2010/0019240 A1 Jan. 28, 2010

(30) Foreign Application Priority Data

Jul. 24, 2008 (KR) .................. 10-2008-0072476

(51) Int. Cl.
*G11C 11/00* (2006.01)

(52) U.S. Cl. .................. 365/148; 365/163; 365/158

(58) Field of Classification Search .................. 257/1–5, 257/43, E21.006, E21.52, E45.001–E45.003, 257/9, 296, 310, E21.35, E31.047, E27.006; 438/104, 482, 691, 692, 29, 95, 96, 166, 438/135, 240, 259, 365, 486, 597, 785; 365/46, 365/94, 100, 113, 129, 148, 151, 158, 163

See application file for complete search history.

(56) References Cited

U.S. PATENT DOCUMENTS

| 2007/0117315 A1* | 5/2007 | Lai et al. ................. 438/257 |
| 2008/0246014 A1* | 10/2008 | Lung ......................... 257/4 |
| 2009/0321711 A1* | 12/2009 | Takagi et al. ............. 257/5 |
| 2010/0090191 A1* | 4/2010 | Lee et al. ................. 257/3 |

FOREIGN PATENT DOCUMENTS

| KR | 1020040054250 | 6/2004 |
| KR | 100687750 | 2/2007 |
| KR | 1020080011956 | 2/2008 |

OTHER PUBLICATIONS

Takagi et al., WO 2008/047530.*
Notice of Preliminary Rejection issued from the Korean Intellectual Property Office on Jun. 14, 2010.
I. G. Baek et al., "Multi-layer Cross-point Binary Oxide Resistive Memory(OxRRAM) for Post-NAND Storage Application",2005 IEEE, 2005, 0-7803-9269-8/05.

* cited by examiner

*Primary Examiner* — Richard Elms
*Assistant Examiner* — Harry W Byrne
(74) *Attorney, Agent, or Firm* — IP & T Group LLP

(57) ABSTRACT

A resistive memory device includes: a bottom electrode formed over a substrate; and an insulation layer having a hole structure formed over the substrate structure. Herein, the hole structure exposes the bottom electrode, has sidewalls of positive slope, and has a bottom width equal to or smaller than a width of the bottom electrode; a resistive layer formed over the hole structure; and an upper electrode formed over the resistive layer.

14 Claims, 3 Drawing Sheets

RESISTIVE MEMORY DEVICE AND METHOD FOR FABRICATING THE SAME

CROSS-REFERENCE TO RELATED APPLICATIONS

The present invention claims priority of Korean patent application number 10-2008-0072476, filed on Jul. 24, 2008, which is incorporated by reference in its entirety.

BACKGROUND OF THE INVENTION

The present invention relates to a memory device and a method for fabricating the same, and more particularly, to a resistive memory device which uses resistance change, such as a resistive random access memory (ReRAM) device, and a method for fabricating the same.

Recently, researches on next-generation memory device, which can replace Dynamic Random Access Memory (DRAM) and flash memory, are actively being conducted.

One of such next-generation memory device is a resistive memory device that uses a resistive layer. The resistive layer includes a material of which resistance rapidly changes according to the applied bias and a switching is performed between two or more different resistive states.

The resistive layer material having the above described characteristic includes a binary oxide including a transition metal oxide or a perovskite-based material.

FIG. 1 illustrates a cross-sectional view of a first typical resistive memory device.

Referring to FIG. 1, the first typical resistive memory device includes a substrate 10. An insulation layer 11 including a contact plug 12 is formed over the substrate 10. A stack structure is formed over the insulation layer 11 and the contact plug 12.

The stack structure includes a bottom electrode 13 formed over the insulation layer 11 and in contact with the contact plug 12, a resistive layer 14, and an upper electrode 15. The stack structure including the bottom electrode 13, the resistive layer 14, and the upper electrode 15 is referred to as a resistive unit 100.

In the first typical resistive memory device, the resistive layer 14 is switched between high resistance state and low resistance state according to a bias applied to the bottom electrode 13 and the upper electrode 15. Thus, data corresponding to each resistance state are stored.

The above mentioned switching mechanism is briefly explained as follows. According to the applied bias, filamentary current paths are formed in the resistive layer 14 to have the low resistance state or the existing filamentary current paths are destroyed to allow the resistive layer to have the high resistance state.

There is, however, a limitation in providing a sufficient switching characteristic to the first typical resistive memory device. Generally, the dimensions of the bottom electrode 13 are substantially the same as or larger than that of the resistive layer 14. Thus, the size of the contacting area between the bottom electrode 13 and the resistive layer 14 depends on the dimensions of the resistive layer 14.

Consequently, the whole resistive layer 14 becomes a switching region when a certain bias is applied to the bottom electrode 13 and the upper electrode 15. When the whole resistive layer 14 becomes a switching region, it becomes difficult to uniformly control generation of filamentary current paths, and in particular, a high reset current may be necessitated. Thus, it becomes difficult to clearly distinguish between the two resistance states. Therefore, it is not easy to implement such a resistive memory device in a current application.

An article by Baek, I. G., Kim, D. C., Lee, M. J., Kim, H. J., Kim, E. K., Lee, M. S., Lee, J. E., Ahn, S. E., Seo, S., and Lee, J. H, entitled "Multi-layer Cross-point Binary Oxide Resistive Memory (OxRRAM) for Post-NAND Storage Application," Institute of Electrical and Electronics Engineers (IEEE), Vol.-No.-[2005], p 769-772 (2005), discloses technology for improving the switching characteristic by forming a bottom electrode in a plug shape to reduce a contacting area between the bottom electrode and a resistive layer. This technology is described in detail hereinafter with reference to FIG. 2.

FIG. 2 illustrates a cross-sectional view of a second typical resistive memory device.

Referring to FIG. 2, the second typical resistive memory device includes a substrate 20. An insulation layer 21 including a contact plug 22 is formed over the substrate 20. A stack structure is formed over the insulation layer 21 and the contact plug 22.

The stack structure includes a resistive layer 23 formed over the insulation layer 21 and in contact with the contact plug 22 and an upper electrode 24. A resistive unit 200 includes the contact plug 22, the resistive layer 23, and the upper electrode 24.

In other words, unlike the first typical resistive memory device shown in FIG. 1 where a bottom electrode is formed separately from a contact plug, the contact plug 22 is used as a bottom electrode in the second typical resistive memory device shown in FIG. 2.

In FIG. 1, the entire resistive layer becomes a switching region. On the other hand, in FIG. 2, only a portion of the resistive layer 23 in contact with the contact plug 22 becomes a switching region (refer to reference denotation 'A' shown in FIG. 2).

Therefore, it becomes easier to uniformly control the generation of filamentary current paths in the second typical resistive memory device shown in FIG. 2. In particular, the number of filamentary current paths decreases as the switching region A decreases so that a reset current may be reduced.

Consequently, the switching characteristic of the device improves. Furthermore, as the dimensions of the contact plug 22 are decreased, the number and distribution of the filamentary current paths may be decreased as well, further enhancing the switching characteristic of the device.

As semiconductor devices are becoming highly integrated recently, the size of devices is getting smaller. It may be generally demanded that the dimensions of a contact plug be further reduced in fabricating a resistive memory device which employs a contact plug as a bottom electrode. However, reducing the dimensions of a contact plug further is reaching a maximum limit due to the process limitations associated with photolithography process and etching process. Therefore, an improved resistive memory device and a method for fabricating the same are in need to overcome the limitations.

SUMMARY OF THE INVENTION

Embodiments of the present invention are directed to providing a resistive memory device and a method for fabricating the same, which can improve a switching characteristic and facilitate the fabrication process by forming a resistive layer using a damascene process and reducing a contacting area between a bottom electrode and the resistive layer.

In accordance with an aspect of the present invention, there is provided a resistive memory device, including: a bottom electrode formed over a substrate; and an insulation layer having a hole structure formed over the substrate structure, wherein the hole structure exposes the bottom electrode, has sidewalls of positive slope, and has a bottom width equal to or smaller than a width of the bottom electrode; a resistive layer formed over the hole structure; and an upper electrode formed over the resistive layer.

In accordance with another aspect of the present invention, there is provided a method for fabricating a resistive memory device, including: forming a bottom electrode over a substrate; forming an insulation layer over the substrate structure; etching a portion of the insulation layer to form a hole structure, wherein the hole structure exposes the bottom electrode, has sidewalls of positive slope, and has a bottom width equal to or smaller than a width of the bottom electrode; forming a material layer for forming a resistive layer over the hole structure; and forming a conductive layer for forming an upper electrode over the material layer.

DESCRIPTION OF SPECIFIC EMBODIMENTS

Other objects and advantages of the present invention can be understood by the following description, and become apparent with reference to the embodiments of the present invention.

Embodiments of the present invention relate to a resistive memory device and a method for fabricating the same. In the embodiments, a switching characteristic may be improved and the fabrication process is facilitated by forming a resistive layer using a damascene process and especially by reducing the size of a contacting area between a bottom electrode and the resistive layer.

Figure 1:
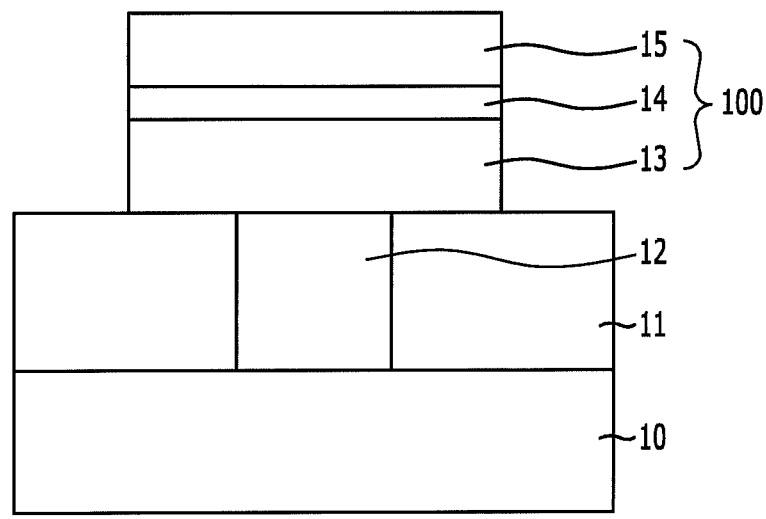
FIG. 1 illustrates a cross-sectional view of a first typical resistive memory device.
Figure 2:
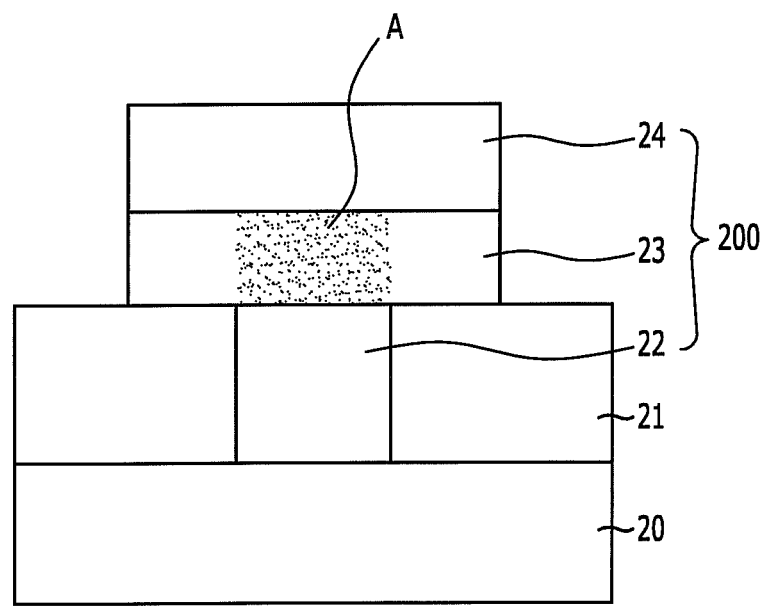
FIG. 2 illustrates a cross-sectional view of a second typical resistive memory device.
Figure 3A:
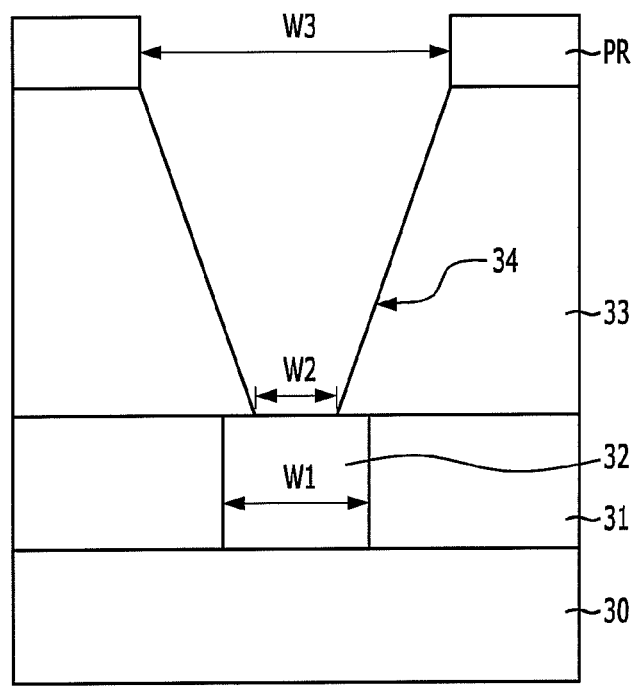
FIGS. 3A to 3C illustrate cross-sectional views of a resistive memory device to describe a method for fabricating the same in accordance with an embodiment of the present invention.
Figure 3B:
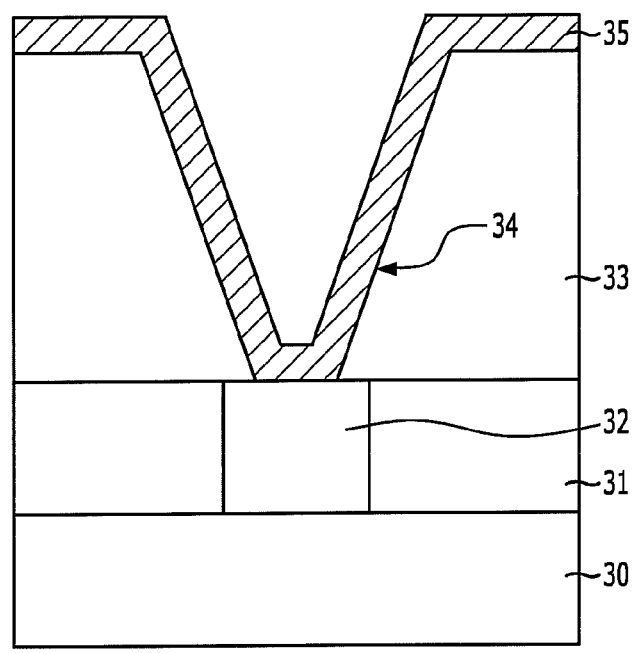
Figure 3C:
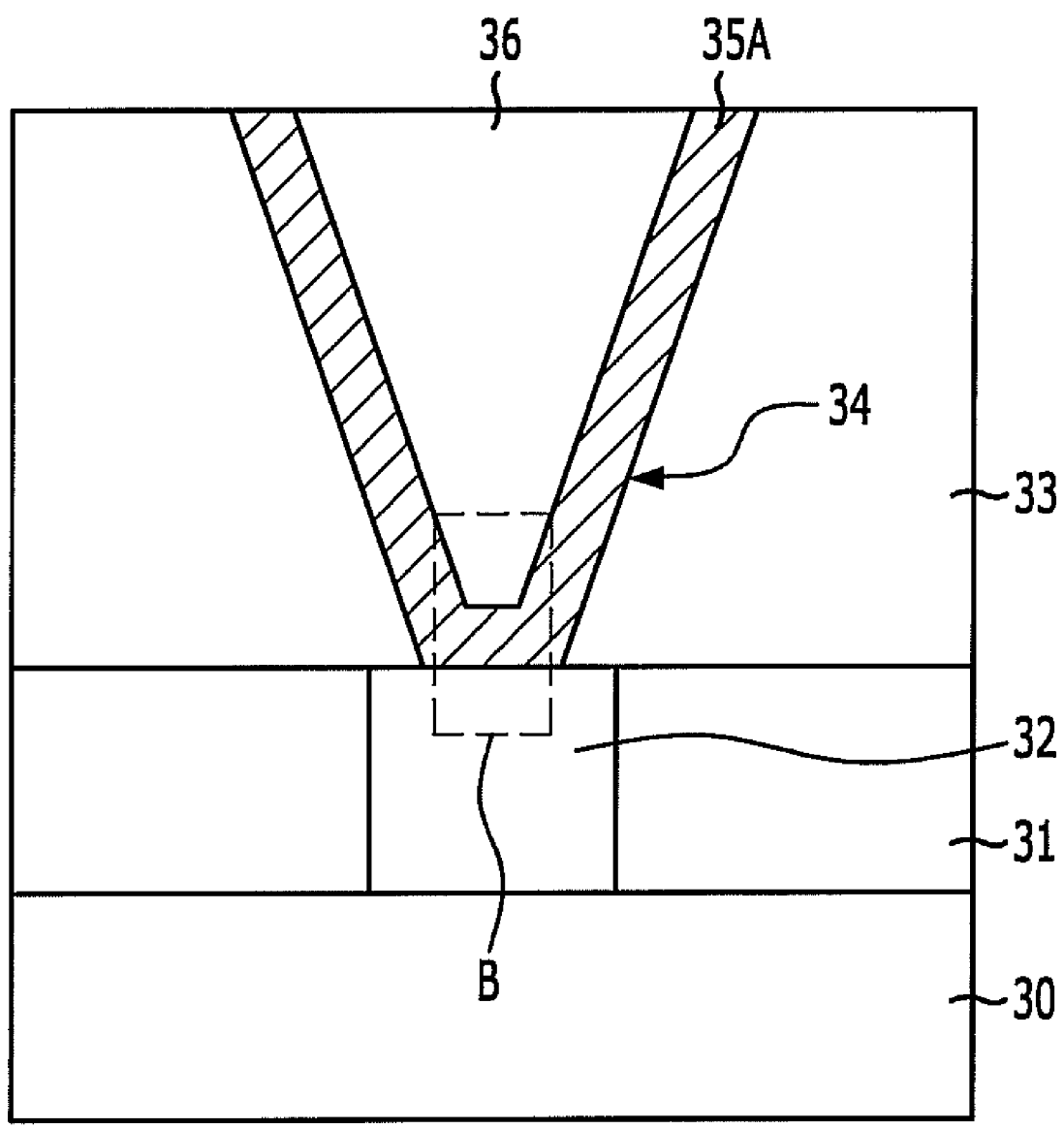

FIGS. 3A to 3C illustrate cross-sectional views of a resistive memory device to describe a method for fabricating the same in accordance with an embodiment of the present invention.

Referring to FIG. 3A, a first insulation pattern 31 including a contact plug 32 is formed over a substrate 30. A second insulation pattern 33 including a hole structure 34 is formed over the first insulation pattern 31 and the contact plug 32. A photoresist pattern PR is formed over the second insulation pattern 33.

To be specific, a first insulation layer is formed over the semi-finished substrate 30 including certain bottom structures. The contact plug 32 is formed in the first insulation layer in a manner to pass through the first insulation layer and come in contact with the substrate 30. Thus, the first insulation pattern 31 including the contact plug 32 is formed.

The contact plug 32 is to be used as a bottom electrode. For instance, the contact plug 32 may include any one among nickel (Ni), cobalt (Co), titanium (Ti), aluminum (Al), aurum (Au), platinum (Pt), tantalum (Ta), chromium (Cr), argentum (Ag) and a combination thereof. Note that materials for forming the contact plug 32 are not limited to the ones described herein.

A second insulation layer is formed over the first insulation pattern 31 and the contact plug 32. The second insulation layer is formed to subsequently form a resistive layer using a damascene process. For instance, the second insulation layer may include an oxide-based layer.

The photoresist pattern PR is formed over the second insulation layer. The photoresist pattern PR defines a region where the subsequent resistive layer is to be formed. The width of a portion exposed by the photoresist pattern PR is denoted with reference denotation W3. The width of the contact plug 32 is denoted with reference denotation W1. For instance, W3 may be larger than W1. A margin for performing a photolithography process may be secured when forming the photoresist pattern PR by forming W3 to a greater width than W1.

The second insulation layer is etched until the contact plug 32 is exposed to form the hole structure 34 using the photoresist pattern PR as an etch barrier. Thus, the second insulation pattern 33 is formed. The etching is performed in such a manner that the hole structure 34 is formed to have positive slopes so that the width of a bottom portion of the hole structure 34, denoted with reference denotation W2, is substantially the same as or smaller than W1 of the contact plug 32. As a result, the hole structure 34 is formed with the bottom width W2 equal to or smaller than W1 of the contact plug 32 and to have a cross-sectional view of an inverse trapezoid shape. The photoresist pattern PR is then removed.

Referring to FIG. 3B, a material layer 35 for forming a resistive layer is formed over the substrate structure. For instance, the material layer 35 may include a binary oxide such as magnesium monoxide (MgO), zinc oxide (ZnO), titanium dioxide ($TiO_2$), nickel oxide (NiO), silicon dioxide ($SiO_2$), niobium pentoxide ($Nb_2O_5$) and hafnium dioxide ($HfO_2$) or a perovskite-based material.

The material layer 35 may be formed to a small thickness which does not completely fill up the hole structure 34. As a result, the operation speed of the device may be increased. The increase of the operation speed will be described hereinafter.

Referring to FIG. 3C, a conductive layer for forming an upper electrode is formed over the material layer 35. A planarization process is performed on the conductive layer until the second insulation pattern 33 is exposed. For instance, a chemical mechanical polishing (CMP) process may be performed. Thus, a resistive layer 35A is formed over inner walls of the hole structure 34. Consequently, an upper electrode 36 is formed over the resistive layer 35A and the hole structure 34.

For instance, the upper electrode 36 may include any one among Ni, Co, Ti, Al, Au, Pt, Ta, Cr, Ag and a combination thereof. Note that materials for forming the upper electrode 36 are not limited to the ones described herein.

Although not illustrated, a subsequent line formation process is performed to apply a bias to the upper electrode 36.

As described above, a contacting area between the contact plug 32, functioning as the bottom electrode, and the resistive layer 35A depends on the resistive layer 35A because the bottom width W2 (FIG. 3A) of the hole structure 34 is equal to or smaller than W1 (FIG. 3A) of the contact plug 32. Therefore, a portion of the resistive layer 35A in contact with the contact plug 32 becomes a switching region B when a certain bias is applied to the contact plug 32 and the upper electrode 36. The width of the switching region B is substantially the same as the bottom width W2 of the hole structure 34. In particular, generation or removal rate of filamentary current paths may be increased and an increased operation speed of the device may be obtained, because the thickness of the portion of the resistive layer 35A functioning as the switching region B is relatively small.

In short, instead of reducing the dimensions of a contact plug as in the typical method, a damascene process is performed in this embodiment to change the shape of the resistive layer 35A with facility. Thus, the switching region B may be further reduced than that of the typical method. As a result, the number and distribution of filamentary current paths may be decreased, and especially, the reset current may be reduced.

Although a resistive memory device, which uses a contact plug as a bottom electrode, is described in this embodiment of the present invention, this invention is not limited to the particular embodiment described herein. The resistive memory device in accordance with the present invention may use a typical flat-shaped bottom electrode because a switching region is determined by the dimensions of a resistive layer.

Furthermore, while a planarization process is performed to form an upper electrode over a hole structure in this embodiment of the present invention, this invention is not limited to the particular embodiment described herein. There are no limits as to the shape of the upper electrode as long as the upper electrode is in contact with a resistive layer of a switching region.

While the present invention has been described with respect to the specific embodiments, it will be apparent to those skilled in the art that various changes and modifications may be made without departing from the spirit and scope of the invention as defined in the following claims.

What is claimed is:

1. A resistive memory device, comprising:
   a bottom electrode formed over a substrate;
   an insulation layer having a hole structure formed over a substrate structure including the bottom electrode and the substrate,
   wherein the hole structure exposes the bottom electrode, has sidewalls downwardly tapered, and has a bottom width same as or smaller than a width of the bottom electrode;
   a resistive layer formed over the hole structure; and
   an upper electrode formed over the resistive layer,
   wherein the resistive layer has first sidewalls contacted to sidewalls of the upper electrode and second sidewalls contacted to the sidewalls of the hole structure,
   wherein the upper electrode is downwardly tapered.

2. The resistive memory device of claim 1, wherein an upper width of the hole structure is greater than the width of the bottom electrode.

3. The resistive memory device of claim 1, wherein the bottom electrode is formed in a plug shape.

4. The resistive memory device of claim 1, wherein a width of a switching region of the resistive layer is determined by the bottom width of the hole structure.

5. The resistive memory device of claim 1, wherein the resistive layer is formed over inner walls of the hole structure to a thickness which does not completely fill up the hole structure, and the upper electrode is formed over the resistive layer and the hole structure.

6. The resistive memory device of claim 1, wherein the resistive layer comprises any one of a binary oxide and a perovskite-based material.

7. The resistive memory device of claim 1, wherein the resistive layer switches between a high resistance state and a low resistance state according to a bias applied to the bottom electrode and the upper electrode.

8. The resistive memory device of claim 1, wherein a hole created by the hole structure is formed in an inverse trapezoid shape.

9. A method for fabricating a resistive memory device, comprising:
   forming a bottom electrode over a substrate;
   forming an insulation layer over a substrate structure including the bottom electrode and the substrate;
   etching a portion of the insulation layer to form a hole structure,
   wherein the hole structure exposes the bottom electrode, has sidewalls downwardly tapered, and has a bottom width same as or smaller than a width of the bottom electrode;
   forming a material layer for forming a resistive layer over the hole structure; and
   forming a conductive layer for forming an upper electrode over the material layer,
   wherein the resistive layer has first sidewalls contacted to sidewalls of the upper electrode and second sidewalls contacted to the sidewalls of the hole structure,
   wherein the upper electrode is downwardly tapered.

10. The method of claim 9, wherein an upper width of the hole structure is greater than the width of the bottom electrode.

11. The method of claim 9, wherein the bottom electrode is formed in a plug shape.

12. The method of claim 9, wherein the material layer for forming the resistive layer is formed to a thickness which does not completely fill up the hole structure.

13. The method of claim 12, further comprising, after forming the conductive layer for forming the upper electrode, performing a planarization process until the etched insulation layer is exposed.

14. The method of claim 9, wherein the hole structure is formed in an inverse trapezoid shape.

* * * * *